United States Patent
Liu et al.

(10) Patent No.: US 11,950,514 B2
(45) Date of Patent: Apr. 2, 2024

(54) CONFINED CELL STRUCTURES AND METHODS OF FORMING CONFINED CELL STRUCTURES

(71) Applicant: Micron Technology, Inc., Boise, ID (US)

(72) Inventors: Jun Liu, Boise, ID (US); Gurtej Sandhu, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 45 days.

(21) Appl. No.: 17/362,322

(22) Filed: Jun. 29, 2021

(65) Prior Publication Data

US 2021/0336129 A1  Oct. 28, 2021

Related U.S. Application Data

(60) Continuation of application No. 14/746,462, filed on Jun. 22, 2015, now abandoned, which is a division of
(Continued)

(51) Int. Cl.
*H10N 50/10* (2023.01)
*G11C 11/16* (2006.01)
(Continued)

(52) U.S. Cl.
CPC ........... *H10N 50/10* (2023.02); *G11C 11/161* (2013.01); *H10N 50/01* (2023.02); *H10N 50/80* (2023.02); *H10N 50/85* (2023.02)

(58) Field of Classification Search
CPC ....... G11C 11/161; H01L 43/02; H01L 43/08; H01L 43/10; H01L 43/12; H10N 50/01; H10N 50/10; H10N 50/80; H10N 50/85
See application file for complete search history.

(56) References Cited

U.S. PATENT DOCUMENTS 7,579,197 B1 8/2009 Li
8,482,966 B2 7/2013 Kang et al.
(Continued)

FOREIGN PATENT DOCUMENTS

WO 2010088669 8/2010

OTHER PUBLICATIONS

Taiwanese Office Action for TW Application No. 101111919 dated Oct. 22, 2014.
(Continued)

*Primary Examiner* — Meiya Li
(74) *Attorney, Agent, or Firm* — Fletcher Yoder, P.C.

(57) ABSTRACT

Techniques for reducing damage in memory cells are provided. Memory cell structures are typically formed using dry etch and/or planarization processes which damage certain regions of the memory cell structure. In one or more embodiments, certain regions of the cell structure may be sensitive to damage. For example, the free magnetic region in magnetic memory cell structures may be susceptible to demagnetization. Such regions may be substantially confined by barrier materials during the formation of the memory cell structure, such that the edges of such regions are protected from damaging processes. Furthermore, in some embodiments, a memory cell structure is formed and confined within a recess in dielectric material.

15 Claims, 8 Drawing Sheets

Related U.S. Application Data application No. 13/079,652, filed on Apr. 4, 2011, now Pat. No. 9,082,956.

(51) Int. Cl.
  *H10N 50/01* (2023.01)
  *H10N 50/80* (2023.01)
  *H10N 50/85* (2023.01)

(56) References Cited

U.S. PATENT DOCUMENTS

| | | | |
|---|---|---|---|
| 8,536,669 | B2 | 9/2013 | Zhu et al. |
| 2002/0186583 | A1 | 12/2002 | Tuttle |
| 2003/0199167 | A1* | 10/2003 | Tuttle ................. H01F 10/3254 257/E27.005 |
| 2004/0012056 | A1* | 1/2004 | Nejad ..................... G11C 11/15 257/E27.005 |
| 2004/0137681 | A1 | 7/2004 | Motoyoshi |
| 2006/0261425 | A1 | 11/2006 | Suemitsu et al. |
| 2009/0174015 | A1 | 7/2009 | Gu et al. |
| 2009/0224341 | A1 | 9/2009 | Li |
| 2009/0256220 | A1 | 10/2009 | Horng et al. |
| 2010/0102404 | A1 | 4/2010 | Li et al. |
| 2010/0117170 | A1 | 5/2010 | Tang et al. |
| 2011/0008915 | A1* | 1/2011 | Nozieres ................. G11C 11/16 438/3 |
| 2011/0044096 | A1 | 2/2011 | Li |
| 2011/0049656 | A1 | 3/2011 | Li et al. |
| 2011/0090732 | A1 | 4/2011 | Li et al. |

OTHER PUBLICATIONS

EP Communication pursuant to Article 94(3) EPC for EP Application No. 12718456.2 dated Sep. 19, 2017.
EP Communication pursuant to Article 94(3) EPC for EP Application No. 12718456.2 dated Sep. 21, 2020.
EP Communication pursuant to Article 94(3) EPC for EP Application No. 12718456.2 dated May 6, 2021.

* cited by examiner

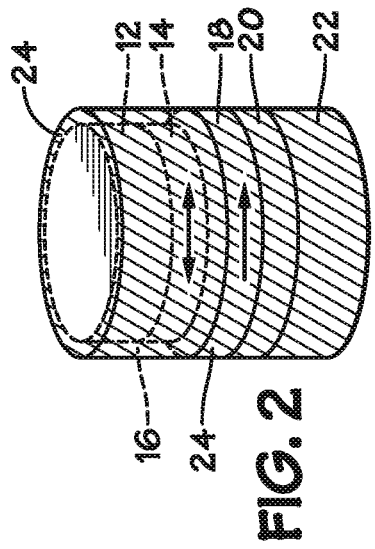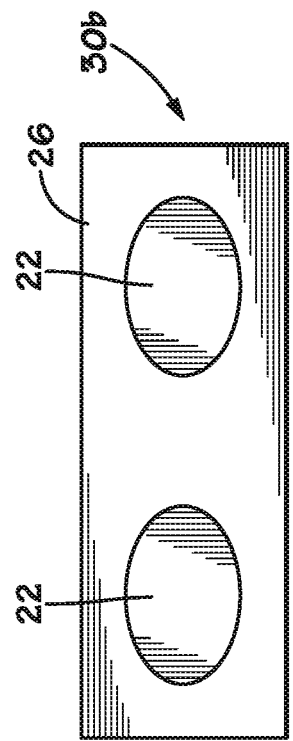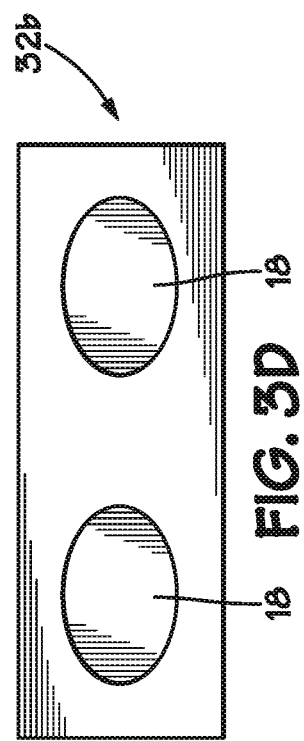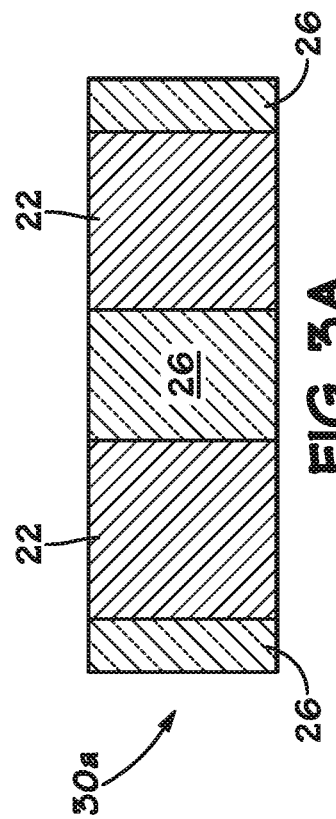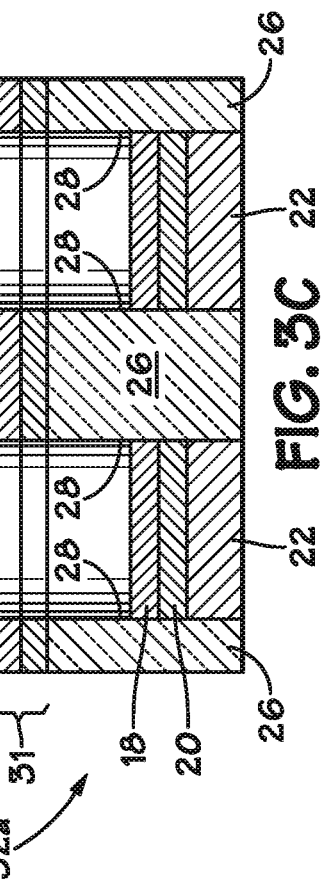

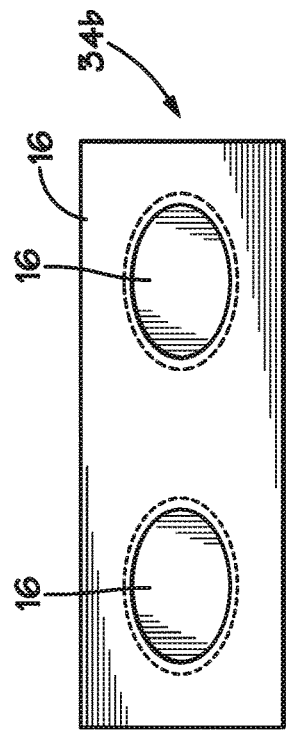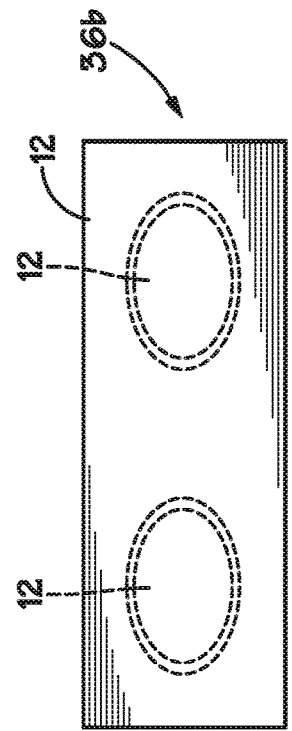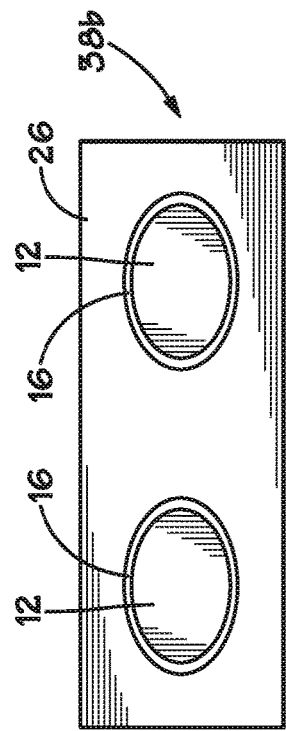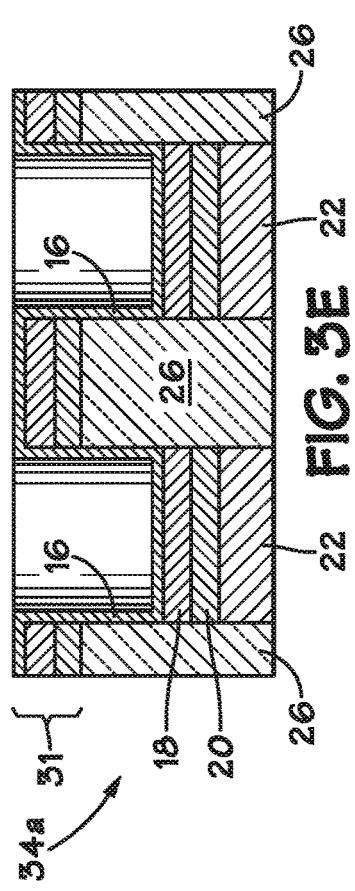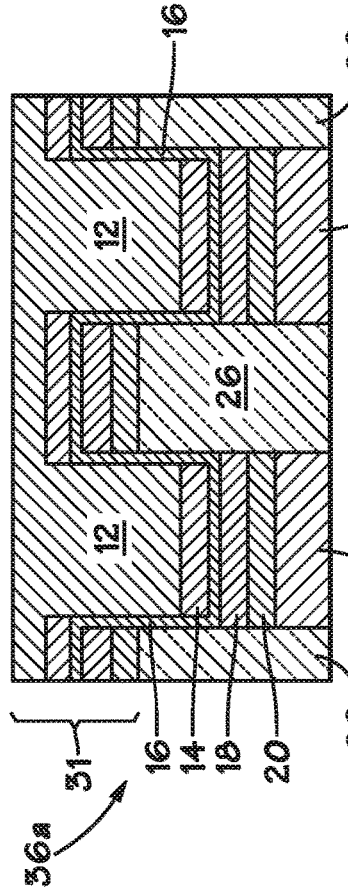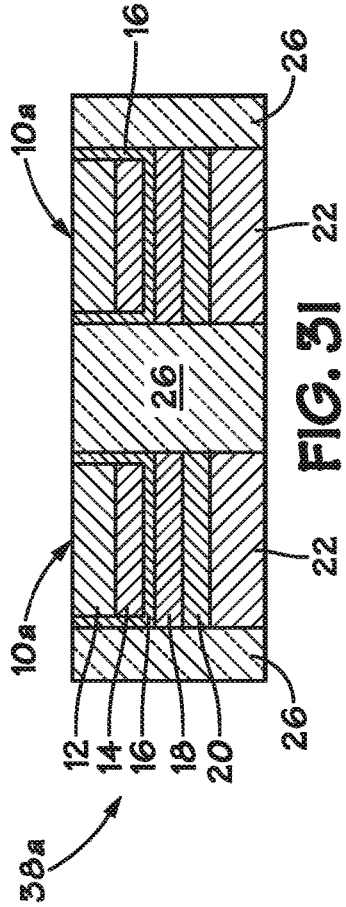

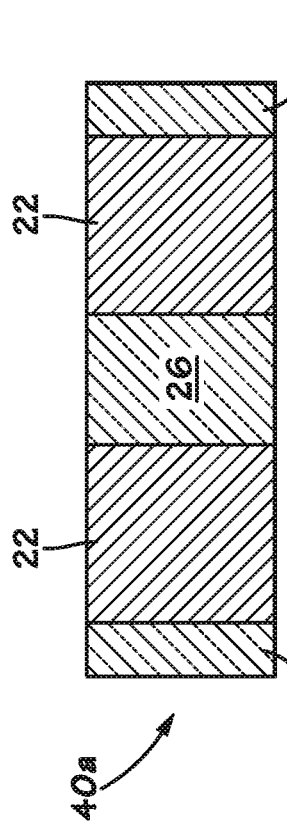
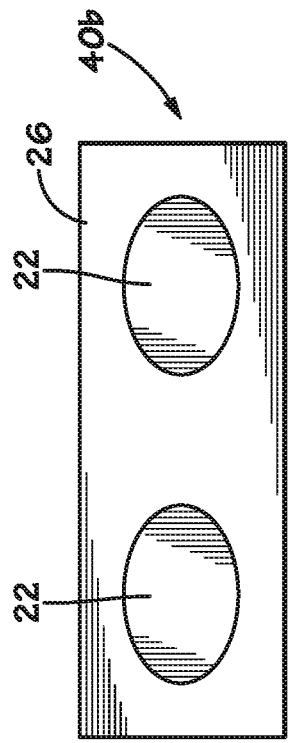
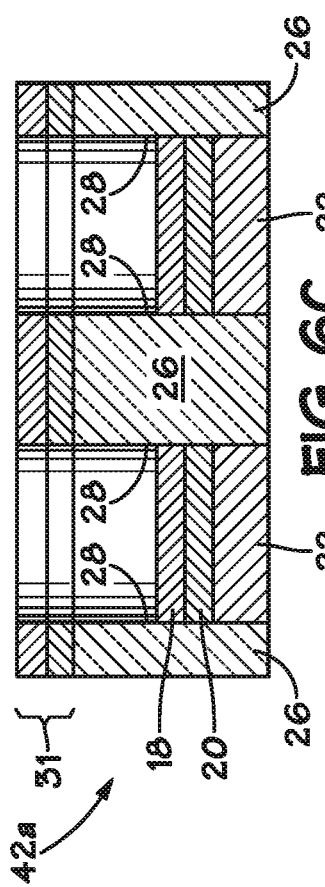
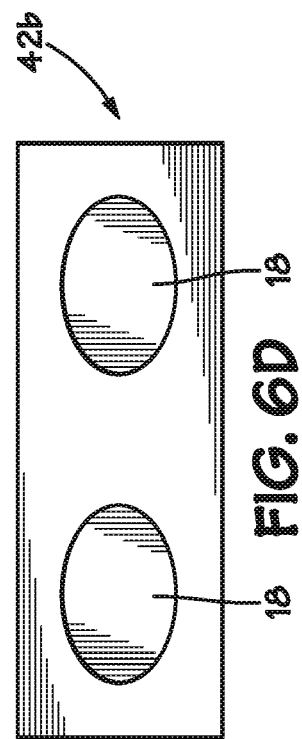
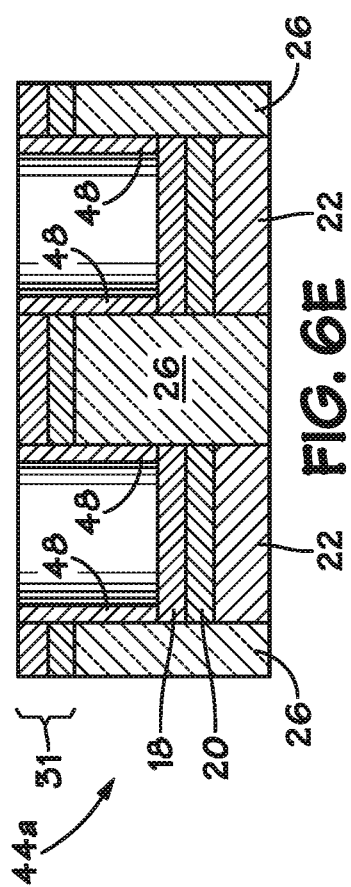
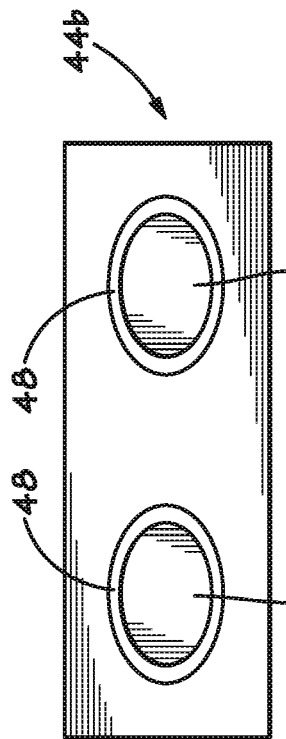

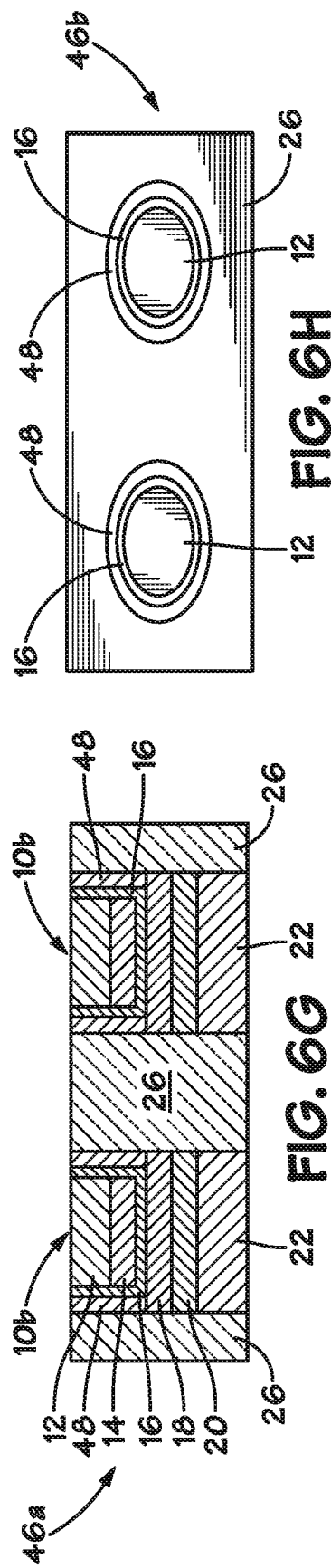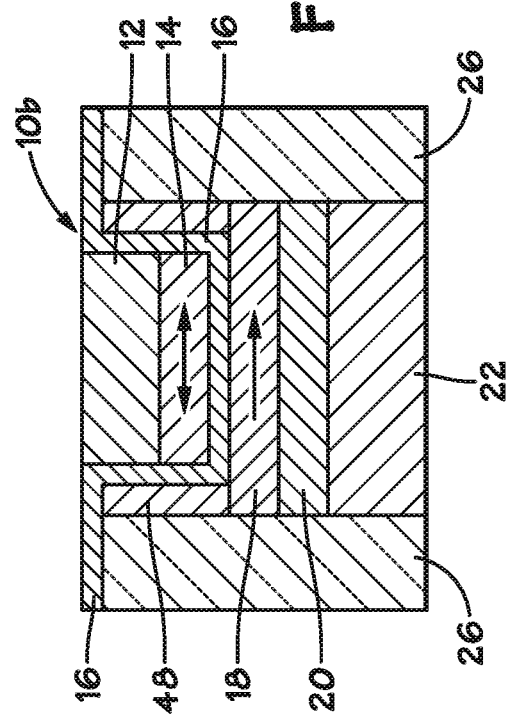

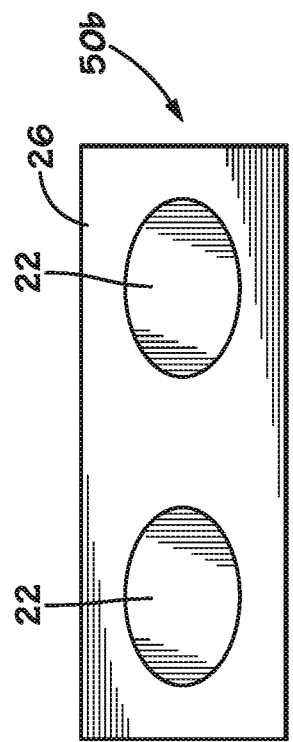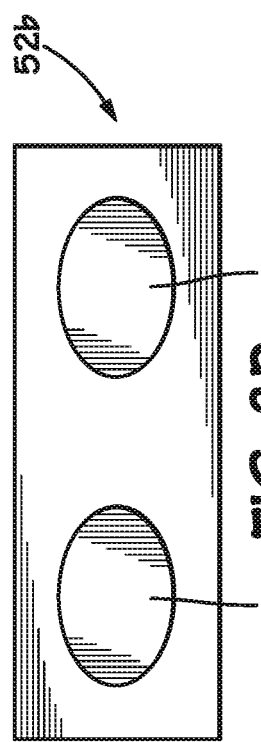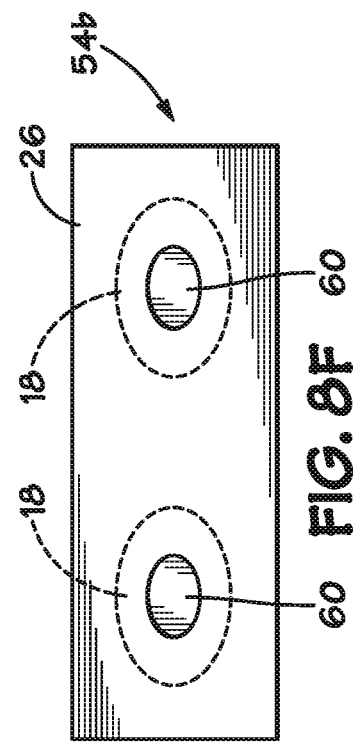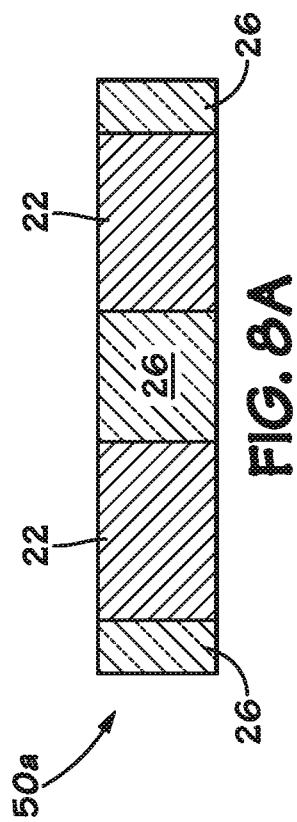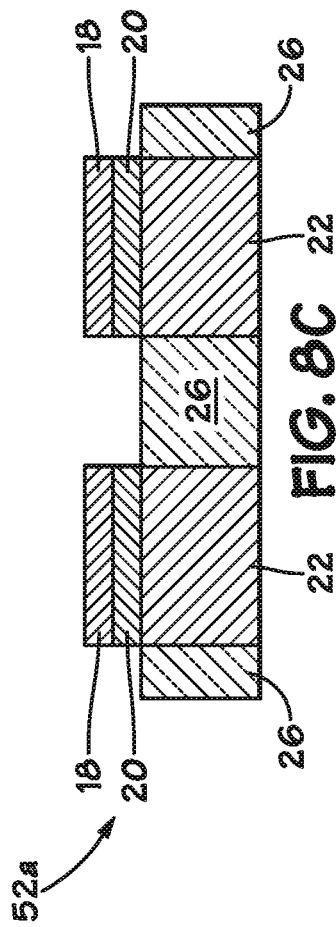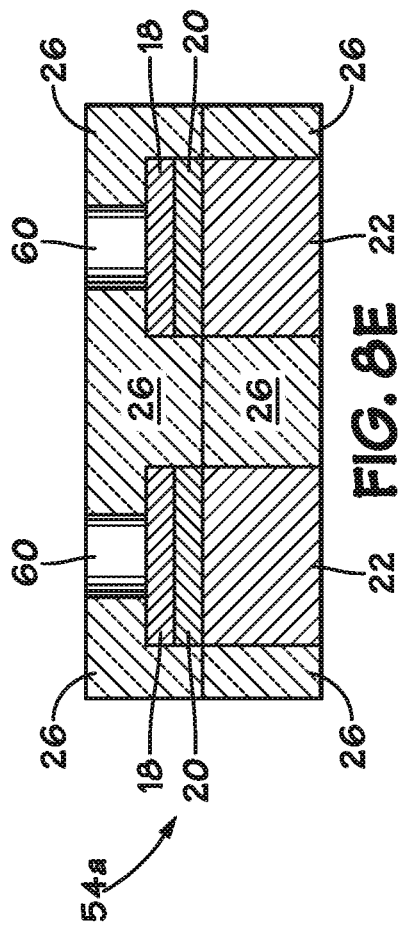

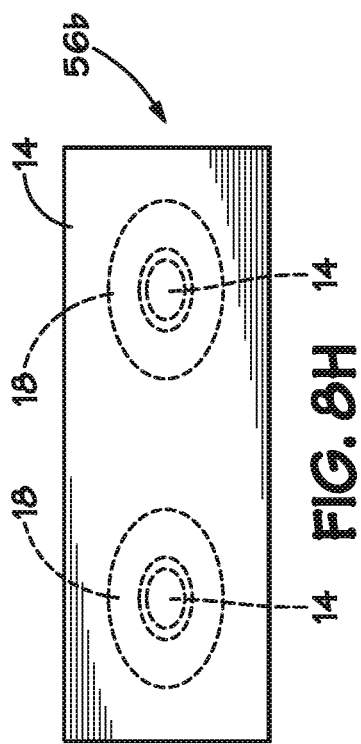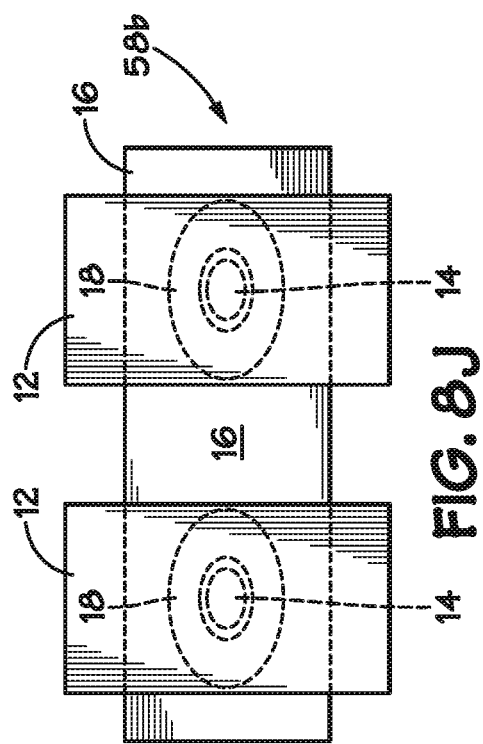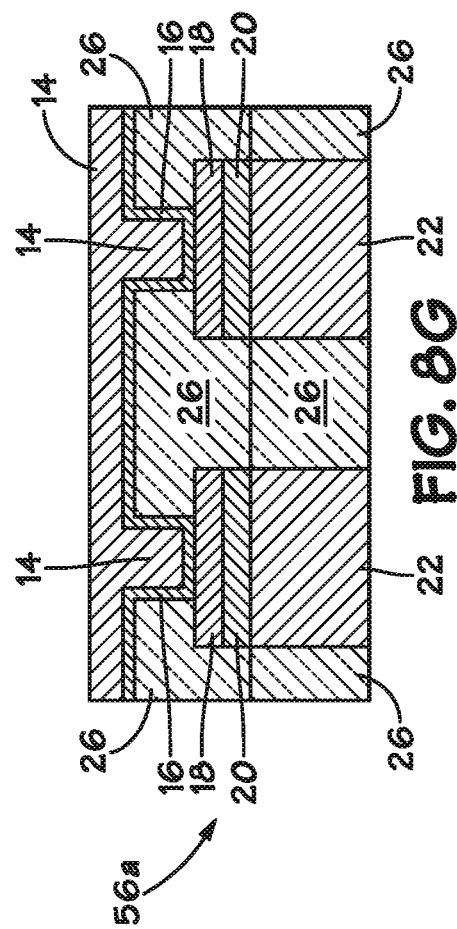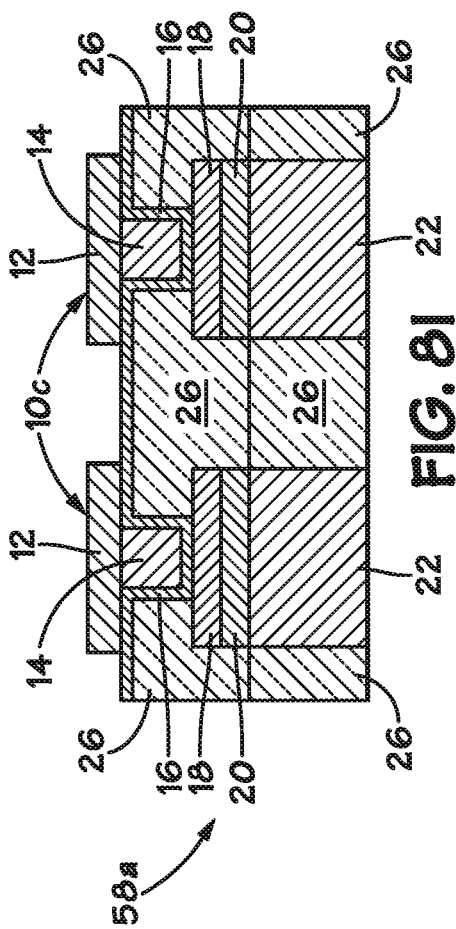

CONFINED CELL STRUCTURES AND METHODS OF FORMING CONFINED CELL STRUCTURES

CROSS REFERENCE TO RELATED APPLICATIONS

This application is a continuation of U.S. application Ser. No. 14/746,462, filed Jun. 22, 2015, which is a divisional of U.S. application Ser. No. 13/079,652, entitled "CONFINED CELL STRUCTURES AND METHODS OF FORMING CONFINED CELL STRUCTURES" filed Apr. 4, 2011, which is now U.S. Pat. No. 9,082,956, the specification of which is incorporated herein by reference in its entirety for all purposes.

BACKGROUND

Field of Invention

Embodiments of the invention relate generally to memory, and more particularly, to techniques for reducing edge damage in magnetic memory cells.

Description of Related Art

This section is intended to introduce the reader to various aspects of art that may be related to various aspects of the present invention, which are described and/or claimed below. This discussion is believed to be helpful in providing the reader with background information to facilitate a better understanding of the various aspects of the present invention. Accordingly, it should be understood that these statements are to be read in this light and not as admissions of prior art.

Magnetic Random Access Memory (MRAM) is a non-volatile memory technology based on magnetoresistance. Unlike typical Random Access Memory (RAM) technologies which store data as electric charge, MRAM data is stored by magnetoresistive elements. Generally, the magnetoresistive elements in an MRAM cell are made from two magnetic regions, each of which holds a magnetization. The magnetization of one region (the "pinned region") is fixed in its magnetic orientation, and the magnetization of the other region (the "free region") can be changed by an external magnetic field generated by a programming current. Thus, the magnetic field of the programming current can cause the magnetic orientations of the two magnetic regions to be either parallel, giving a lower electrical resistance across the magnetoresistive elements ("0" state), or antiparallel, giving a higher electrical resistance across the magnetoresistive elements ("1" state) of the MRAM cell. The switching of the magnetic orientation of the free region and the resulting high or low resistance states across the magnetoresistive elements provide for the write and read operations of the typical MRAM cell.

A spin torque transfer MRAM (STT-MRAM) cell is another type of memory cell which is programmed by changing the magnetization of magnetoresistive elements. The STT-MRAM cell is written by transmitting a programming current through a magnetic cell stack including a free region and a pinned region. The programming current is polarized by the pinned region to have a spin torque. The spin-polarized current then exerts the torque on the free region, switching the magnetization of the free region. The magnetization of the free region can be aligned to be either parallel or antiparallel to the pinned region, and the resistance state across the stack is changed.

The manufacture of conventional memory cells, including MRAM cells and STT-MRAM cells, may involve a series of steps to form the different regions (e.g., the pinned region, the free region, insulating or conductive regions, etc.) of the cell. However, in typical manufacturing techniques, certain steps may cause damage to the cell structure. For example, dry etching may result in demagnetization of the free region, which may affect the programmability of the magnetic memory cell. Furthermore, as cell structures are manufactured to be increasingly small in size, the effects of such damage may be more detrimental to the function of the cell.

BRIEF DESCRIPTION OF DRAWINGS

Certain embodiments are described in the following detailed description and in reference to the drawings in which:

FIG. 1 is an illustration of an STT-MRAM cell structure, in accordance with an embodiment of the present technique;

FIG. 2 is an illustration of an STT-MRAM cell structure having edge damage;

FIGS. 3A-3J illustrate a series of side views and corresponding top views of one technique for forming an STT-MRAM cell structure having reduced edge damage, in accordance with embodiments of the present technique;

FIGS. 6A-6H illustrate a series of side views and corresponding top views of a technique for forming an STT-MRAM cell having reduced edge damage using spacer regions, in accordance with embodiments of the present technique;

FIG. 7 is a side view of the STT-MRAM cell structure formed using the technique illustrated in FIG. 6, in accordance with embodiments of the present technique;

FIGS. 8A-8J illustrate a series of side views and corresponding top views of a technique for forming an STT-MRAM cell having reduced edge damage using vias, in accordance with embodiments of the present technique;

DETAILED DESCRIPTION

Figure 4:
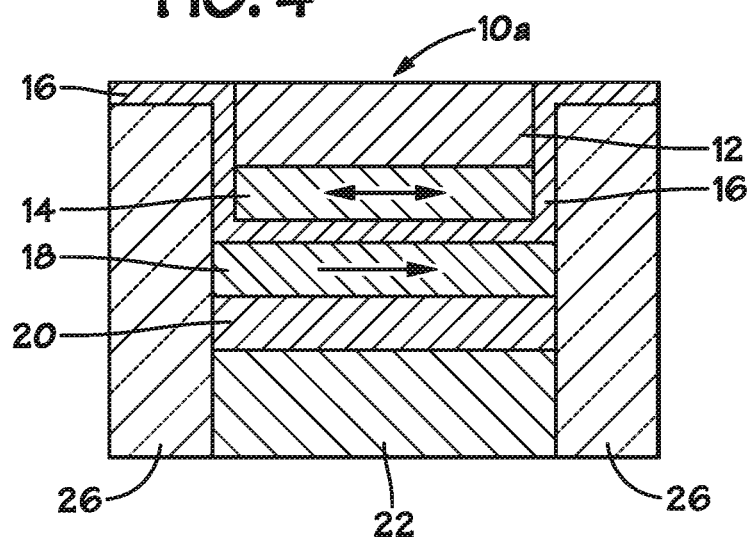
FIG. 4 is a side view of the STT-MRAM cell structure formed using the technique illustrated in FIG. 3, in accordance with embodiments of the present technique.

A magnetic memory cell is typically programmed by changing a magnetic resistance in the cell. For example, a magnetic memory cell, referred to herein as a cell, may include regions of magnetic materials. During programming, one magnetic region of the cell, referred to as the "free region," may be switched in magnetization, and another magnetic region, referred to as the "pinned region," may remain fixed in magnetization. Typically, the free region magnetization may be switched between two opposite directions to be either parallel or antiparallel to the pinned region magnetization. When the magnetizations of the free and pinned regions are parallel, the resistance across the regions may be low, and when the magnetizations of the free and pinned regions are antiparallel, the resistance across the regions may be high. Thus, a magnetic memory cell may be programmed to either a low or a high resistance state by switching the magnetization of the free region.

One example of such a magnetic memory cell is a spin torque transfer magnetic random access memory (STT-MRAM) cell. A programmable structure of the STT-MRAM cell, referred to as a cell structure 10, is illustrated in FIG. 1. The cell structure 10 may include a free region 14 which may be switched in magnetization to be either parallel or anti-parallel to the magnetization of the pinned region 18. In some embodiments, the free region 14 and the pinned region 18 may include the same or different materials. For example, each of the free and pinned regions 14 and 18 may include magnetic materials or ferromagnetic materials such as Co, Fe, Ni or its alloys, NiFe, CoFe, CoNiFe, or doped alloys CoX, CoFeX, CoNiFeX (X=B, Cu, Re, Ru, Rh, Hf, Pd, Pt, C), or other half-metallic ferromagnetic material such as $Fe_3O_4$, $CrO_2$, NiMnSb, PtMnSb, and BiFeO, or any combination of the above materials.

The free region 14 and the pinned region 18 may have a barrier region 16 in between, which may be suitable for separating the free and pinned regions 14 and 18 and substantially preventing coupling between the magnetizations of the two regions 14 and 18. For example, the barrier region 16 may include conductive, nonmagnetic materials such as Cu, Au, Ta, Ag, CuPt, CuMn, nonconductive, nonmagnetic materials such as $Al_xO_y$, $MgO_x$, $AlN_x$, $SiN_x$, $CaO_x$, $NiO_x$, $HfO_x$, $Ta_xO_y$, $ZrO_x$, $NiMnO_x$, $MgF_x$, SiC, $SiO_x$, $SiO_xN_y$, or any combination of the above materials. The cell structure 10 may also include an antiferromagnetic region 20 suitable for fixing the magnetization of the pinned region 18 through exchange coupling, thereby increasing cell stability.

During a write operation of an STT-MRAM cell, a programming current is applied to the cell structure 10 of the cell that is selected for programming. To initiate the write operation, a write current may be generated and passed through a data line, which may each be connected to a top lead 12 or a bottom lead 22 of the cell 10. The top lead 12 and the bottom lead 22 may include conductive materials such as copper and palladium, for example. In some embodiments, the top lead 12 and bottom lead 22 may each be connected to a data/sense line, for example a bit line of the memory cell, such that a programming current may be transmitted longitudinally through the regions of the cell structure 10. As the programming current passes from the bottom lead 22 to the pinned region 18 of the cell structure 10, the electrons of the programming current are spin-polarized by the pinned region 18 to exert a torque on the free region 14, which switches the magnetization of the free region 14 to "write to" or "program" the cell.

In a read operation of the STT-MRAM cell, a current is used to detect the programmed state by measuring the resistance through the cell structure 10. To initiate a read operation, a read current may be generated and passed from a data line through the cell structure 10, from the top lead 12 to the bottom lead 22 (or from the bottom lead 22 to the top lead 12, in some embodiments). The voltage difference between the data lines may be different depending on the resistance through the cell structure 10, thus indicating the programmed state of the STT-MRAM cell. In some embodiments, the voltage difference may be compared to a reference and amplified by a sense amplifier.

Therefore, a memory cell such as an STT-MRAM cell may have multiple regions, including at least a free region 14 and a pinned region 18 arranged such that a programming current can program the cell and read a resistance through the cell structure 10. Typically, such cell structures are manufactured using a series of steps including depositing materials, planarizing deposited materials to form regions in the cell structure, and dry etching the materials to form cell structures having a certain dimension (e.g., having a diameter of 100 nm). However, dry etch processes may damage the edges of the cell structure, which may result in the demagnetization of the free region and/or the pinned region, the generation of electron spin scattering centers, and/or shortages across cell structure. Moreover, as cell structures are increasingly manufactured to be smaller in size (e.g., having a diameter of 50 nm or less), the damage to the edges of the cell structure may be even more detrimental to the performance of the magnetic memory cell due to the larger surface-area-to-volume ratio of the cell structure. An illustration of edge damage is provided in FIG. 2, where the hatched region surrounding the perimeter of the cell structure 10 represents damaged regions 24.

In one or more embodiments, the cell structure 10 may be formed with reduced edge damage (also referred to as etch damage). In the techniques and cell structures illustrated in FIGS. 3-10, certain damaging processes such as dry etching or planarizing may be eliminated, and in some embodiments, sensitive regions or materials (e.g., the free region 14) may be separated from damaging processes to substantially limit potential demagnetization in the magnetic materials. Though the techniques and cell structures illustrated in FIGS. 3-10 generally apply to STT-MRAM cell structures, it should be noted that STT-MRAM cells are merely an example of one or more embodiments. The present techniques may apply to any type of magnetic memory cell having magnetic materials susceptible to demagnetization due to edge damage. Additionally, some embodiments, as described with respect to FIGS. 3-10, may apply to any memory cell structure, or to any structure having regions of materials which may be sensitive to edge damage.

Beginning first with FIGS. 3A-3J, an embodiment for forming a cell structure without dry etching the edges of the free layer 14 is described. The process steps are represented by structures 30, 32, 34, 36, and 38, which illustrate side views (labeled 30a, 32a, 34a, 36a, and 38a) and corresponding top views (labeled 30b, 32b, 34b, 36b, and 38b) of intermediate structures (referred to as structures) in the formation of two confined STT-MRAM cell structures in a dielectric material. The process described utilizes two cells for simplification of the process. Any number of cells can be formed from the described process. As used herein, confined STT-MRAM cell structures may refer to STT-MRAM cell structures having at least a free region formed in a recess, cavity, via, etc. in dielectric materials. The process begins with forming the bottom lead 22 in a substrate 26, as illustrated in view 30a (FIG. 3A). The substrate 26 may include dielectric material (and may also be referred to as the dielectric substrate 26, or the dielectric material 26) or any other suitable material for separating different cell structures. In one embodiment, a photolithography and dry etch process may be used to recess the dielectric material 26, and conductive materials, such as copper or palladium, may be deposited to form the bottom lead 22 in the recesses of the dielectric material 26. For example, a patterned mask may be used to form the dimensions of the bottom leads 22 and arrange the bottom leads in the dielectric material 26. As indicated in view 30b (FIG. 3B), the bottom leads 22 may be oval in the dielectric material 26, though different embodiments may include various shapes.

As illustrated in FIGS. 3C and 3D, the process may then involve etching the bottom lead 22 to recess the bottom lead 22 to a certain height in the recess, as in structure 32a. The etching of the bottom lead 22 material may be via wet etch or other etch processes known in the art. Antiferromagnetic materials are then deposited in the recess to form an antiferromagnetic region 20, and magnetic materials are deposited over the antiferromagnetic region 20 to form the pinned region 18. As discussed, the pinned region 18 may have a fixed magnetization achieved through exchange coupling with the antiferromagnetic region 20. In some embodiments, the antiferromagnetic materials and the magnetic materials are deposited to form the antiferromagnetic region 20 and the pinned region 18. Each may be directionally deposited, such that the regions 20 and 18 are formed in one direction. For example, the antiferromagnetic region 20 and the pinned region 18 may be formed on horizontal surfaces (e.g., in a lateral direction), and may not be deposited on the vertical sidewalls 28 (e.g., in a longitudinal direction). In some embodiments, a wet etch may be applied after the deposition of the magnetic materials forming the pinned region 18 to remove excess materials (e.g., materials deposited on the vertical sidewalls 28). Excess materials 31 (e.g., antiferromagnetic materials and magnetic materials) may also be formed over the dielectric 26 and may be removed at a later step in the process. The top view of the structure 32b illustrates the pinned region 18 visible in the recesses.

Barrier materials are then deposited into the recess to form a barrier region 16 in the structure 34a (FIG. 3E). The barrier materials may include nonconductive, nonmagnetic materials such as $Al_xO_y$, $MgO_x$, $AlN_x$, $SiN_x$, $CaO_x$, $NiO_x$, $HfO_x$, $Ta_xO_y$, $ZrO_x$, $NiMnO_x$, $MgF_x$, SiC, $SiO_x$, $SiO_xN_y$, or any combination of the above materials. The barrier materials may be suitable for physically separating the pinned region 18 from a free region 14 and for substantially preventing magnetic coupling effects between the pinned region 18 and the free region 14. In some embodiments, the barrier region 16 may be formed by conformal deposition, which result in a barrier region 16 disposed over a top surface of the pinned region 18 and over the vertical sidewalls 28 of the recess. In other embodiments, the barrier region 16 may be formed by directional deposition, or any other types or combinations of depositions methods which result in a barrier region 16 disposed over a top surface of the pinned region 18. As illustrated in the top view of the structure 34b (FIG. 3F), barrier materials 16 may substantially cover the previously deposited materials.

Magnetic materials are then directionally deposited over the barrier region 16 to form the free region 14. In some embodiments, a wet etch may be used to remove any excess materials, including magnetic materials deposited on the vertical sidewalls 28. Suitable conductive materials such as copper or palladium may then be deposited over the free region 14 to form a top lead 12 in the structure 36a (FIG. 3G). As illustrated in the top view of the structure 36b (FIG. 3H), the materials of the top lead 12 may substantially cover the recessed areas, as well as the substrate.

As illustrated in structure 36a (FIG. 3I), excess materials 31 may include one or more of the previously deposited materials, including antiferromagnetic (from forming the antiferromagnetic region 22), magnetic (from forming the pinned and free regions 18 and 14), barrier (from forming the barrier region 16), and conductive materials (from forming the top lead 12). Such excess materials 31 may not be useful for functioning of the STT-MRAM cell structure 10a. In some embodiments, a CMP process may be applied to remove the excess materials 31. The CMP process may stop at the dielectric material between the formed cell structures 10a, and the remaining structure 38a may include cell structures 10a separated by dielectric materials 26. As illustrated in the top view of the structure 38b (FIG. 3J), the barrier region 16 may separate the top lead 12 from the surrounding dielectric 26.

Figure 5:
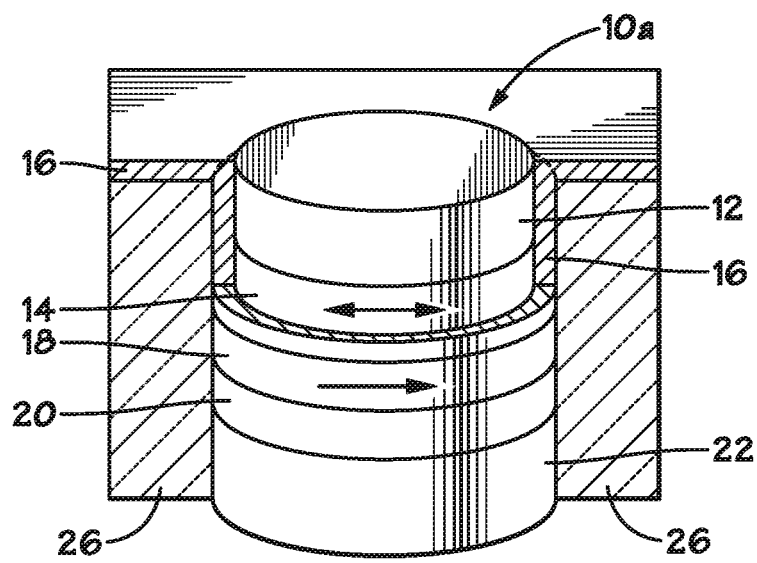
FIG. 5 is a three-dimensional view of the STT-MRAM cell structure illustrated in FIG. 4, in accordance with embodiments of the present technique.

Therefore, by employing the techniques discussed in FIGS. 3A-3J, dry etching is not used to form the cell structures 10a. Rather, a series of CMPs, depositions, and wet etching may be employed to form recesses for the cell structures 10a, deposit various regions, and remove unwanted materials. The remaining cell structures 10a are contained in the original recesses and surrounded by the dielectric material 26. By avoiding techniques such as dry etching, damage to the cell structure 10a, and in particular, damage to the free region 14 and the barrier region 16, may be reduced. A side view of the completed cell structure 10a formed by the process of FIGS. 3A-3J is provided in FIG. 4. Further, a three-dimensional view of this cell structure 10a is illustrated in FIG. 5.

Another embodiment for forming cell structures 10b having reduced edge damage is provided in FIGS. 6A-6H. FIGS. 6A-6H illustrate a series of side views (labeled 40a, 42a, 44a, and 46a) and top views (labeled 40b, 42b, 44b, and 46b) of intermediate structures 40, 42, 44, and 46 in forming a cell structure 10b having a spacer 48. The spacer 48 may be configured to reduce an area and/or a volume of the free region 14. Typically, the size of a programming current applied to program an STT-MRAM cell is directly related to the size of the free region 14, as a larger current may be used to switch the magnetization of a larger volume of magnetic material. As such, forming a cell structure with a spacer 48 may result in a smaller free region 14 which may be switched in magnetization by a smaller programming current.

Similar to the structures 30 and 32 formed in the process of FIGS. 3A-3J, the process illustrated in FIGS. 6A-6H may also involve forming recesses in the dielectric material 26 and depositing conductive materials in the recesses to form the bottom leads 22, as illustrated in the structure 40 (FIGS. 6A and 6B). The bottom lead material may then be wet etched to form bottom leads 22 having a certain height in the recess, and antiferromagnetic materials and magnetic materials may be deposited over the bottom leads 22 to form the antiferromagnetic region 20 and pinned region 18, as illustrated in the structure 42 (FIGS. 6C and 6D). The vertical sidewalls 28 may also be wet etched to remove excess materials.

In some embodiments, nonmagnetic materials such as silicon nitride (SiN) may be deposited to form the spacer region 48 (FIG. 6E). The SiN may be deposited conformally. The SiN may be dry etched in some embodiments, such that only a region of SiN remains against the sidewalls 28 of the trench. Although dry etch may be used in this process, the dry etch may not result in demagnetization of the free region 14 or damage to the barrier region 16, as the magnetic materials for the free region 14 may be deposited after the dry etch process which forms the spacer regions 48. As illustrated in the top view of the structure 44b (FIG. 6F), the spacer region 48 may be visible in the cavity and may be formed above the exposed pinned region 18.

Once the spacer regions 48 are formed, barrier materials may be deposited into the recess such that it is disposed over the spacer region 48 in a vertical (longitudinal) direction and disposed over the pinned region 18 in the horizontal (lateral) direction, forming the barrier region 16. In different embodiments, the deposition of barrier materials may be either a conformal or a directional deposition. Magnetic materials may be directionally deposited over the barrier region 16 to form the free region 14, and conductive materials may be deposited over the free region 14 to form the top lead 12. In between depositions of different materials, a wet etch may be applied to remove excess materials from the sidewalls 28 of the trench. Furthermore, a CMP process may be used to remove excess materials 31 from the top portions of the dielectric material 26 until the planarization reaches the dielectric 26, which may result in a structure 46 (FIGS. 6G and 6H) having complete cell structures 10*b* separated by dielectric 26. As illustrated in the top view of the structure 46*b*, the top lead 12 may be exposed, and may be surrounded by a barrier region 16, which is further surrounded by a spacer region 48 in the recesses of the dielectric 26.

A larger version of the cell structure 10*b* formed by the process discussed in FIG. 6 is provided in FIG. 7. As shown in FIG. 7, the cell structure 10*b* may include a spacer region 48 surrounding a barrier region 16 surrounding the free region 14, thus reducing the volume of the free region 14 and reducing a programming current which may be applied to switch the magnetization of the free region 14. It should be noted that although the CMP process removing excess materials 31 is described as stopping on the dielectric material 26 in FIG. 6, the CMP process may also instead stop at the barrier region 16, as illustrated in FIG. 7.

Another embodiment for forming cell structures 10*c* having reduced edge damage is provided in FIGS. 8A-8J. FIGS. 8A-8J illustrates a series of side views (labeled 50*a*, 52*a*, 54*a*, 56*a*, and 58*a*) and top views (labeled 50*b*, 52*b*, 54*b*, 56*b*, and 58*b*) of intermediate structures 50 (e.g., 50*a* and 50*b*), 52 (e.g., 52*a* and 52*b*), 54 (e.g., 54*a* and 54*b*), 56 (e.g., 56*a* and 56*b*), and 58 (e.g., 58*a* and 58*b*) in forming a cell structure 10*c*. The process may involve a CMP process and a patterned mask to form recesses in the dielectric material 26 where materials may be deposited to form cell structures 10*c*. Conductive materials may be deposited in the recesses to form the bottom lead 22, as illustrated in structure 50.

A patterned mask may be used to form the antiferromagnetic region 20 and the pinned region 18 over the bottom lead 22. Specifically, as represented by the structure 52*a* (FIG. 8C), the patterned mask may be positioned such that antiferromagnetic materials may be disposed over the bottom lead 22 to form the antiferromagnetic region 20, and magnetic materials may be disposed over the antiferromagnetic region 20 to form the pinned region 18. As illustrated in the top view of the structure 52*b* (FIG. 8D), the pinned region 18 may be exposed.

In some embodiments, additional dielectric material 26 may be deposited over the original dielectric material 26 and may cover some portions of the pinned region 18, as illustrated in the structure 54*a* (FIG. 8E), and an additional mask may be used such that vias 60 are formed in the additional dielectric material 26. The vias 60 may expose a portion of the pinned region 18. As illustrated in the top view of the structure 54*b* (FIG. 8F), the via 60 may expose a portion of the pinned region 18 while the remaining top surface of the structure 54 includes dielectric material 26.

Barrier materials may then be conformally or directionally deposited over the structure 54 and into the via 60 to form a barrier region 16, such that all surfaces of the via 60 may be covered by the barrier region 16. The barrier region 16 surrounding the via 60 may also be referred to as the tunnel barrier and may have a U-shaped or cup shaped structure. Magnetic materials may be deposited over the structure 54 and onto the tunnel barrier to form the free region 14, as illustrated in the structure 56*a* (FIG. 8G). As illustrated in the top view of the structure 56*b* (FIG. 8H), the top of the structure 56 (including the recesses and the surrounding dielectric 26) may be covered by the magnetic materials deposited for forming the free region 14.

In some embodiments, a CMP process may be used to planarize the materials deposited for the free region 14, such that the volume of the free region 14 is substantially contained in the via 60 surrounded by the barrier region 16 in each cell structure 10*c*. Suitable conductive materials may be deposited to form the top lead 12, as illustrated in the structure 58*a* (FIG. 8I). In some embodiments, the original patterned mask used to recess the dielectric may be used to form the top lead 12, or in other embodiments, a different mask or no mask may be used. The top view of the structure 58*b* (FIG. 8J) depicts the top lead 12 configured to be the data line (or to be connected to the data line) of the cell structure 10*c*.

Figure 9:
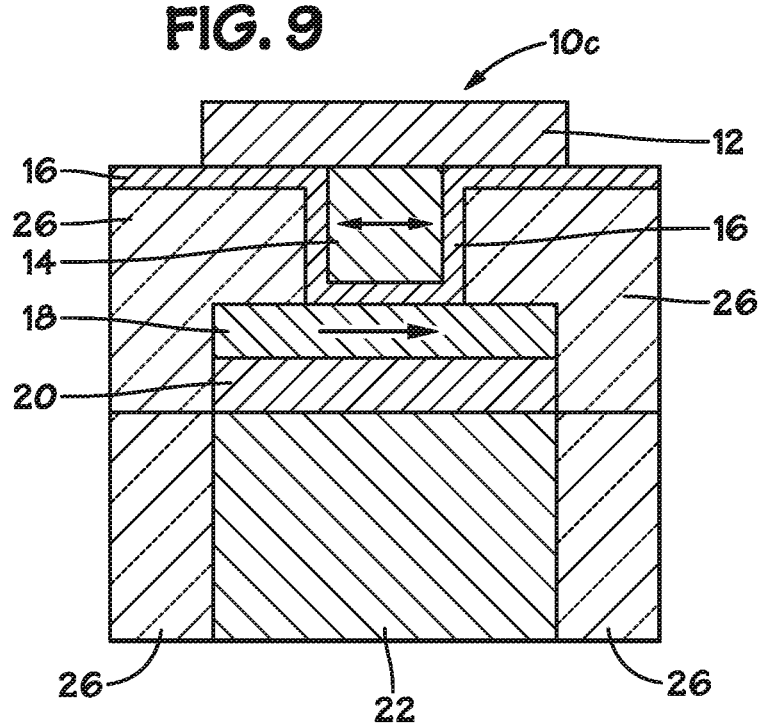
FIG. 9 is a side view of the STT-MRAM cell structure formed using the technique illustrated in FIG. 8, in accordance with embodiments of the present technique.

A larger version of the cell structure 10*c* formed by the process discussed in FIGS. 8A-8J is provided in FIG. 9. As shown in FIG. 9, the free region 14 is substantially contained in between the tunnel barrier of the barrier region 16 and the top lead 12. Although portions of the cell structure 10*c* are formed over the bottom lead 22 and are not completely confined, any dry etch or CMP processes may not substantially affect the contained free region 14. Therefore, the free region 14 may be protected from etch damage and may not lose magnetization.

Figure 10:
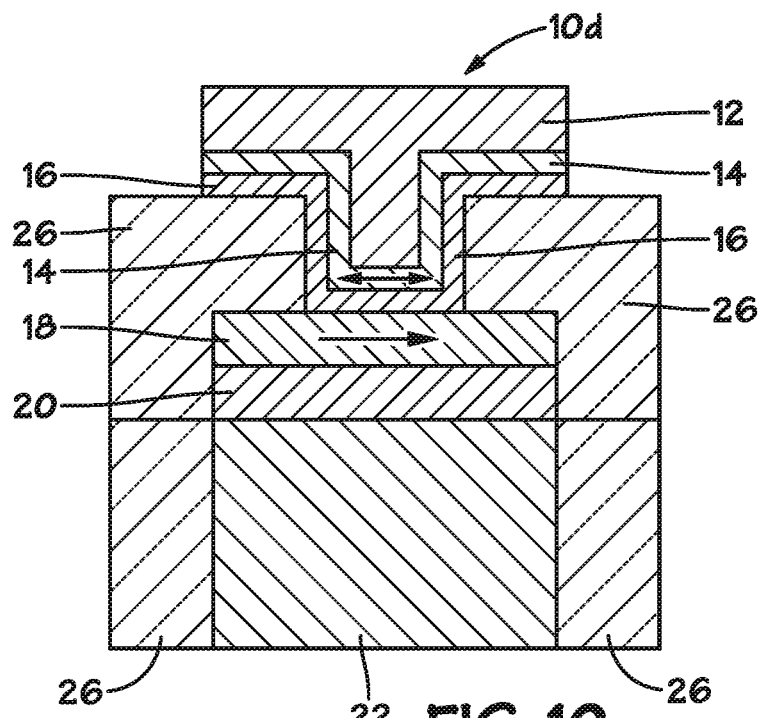
FIG. 10 is a side view of another STT-MRAM cell structure formed using the technique illustrated in FIG. 8, in accordance with embodiments of the present technique.

A similar process as that described in FIGS. 8A-8J may be used to obtain the cell structure 10*d* illustrated in FIG. 10. The cell structure 10*d* may be formed by depositing magnetic materials to form a thinner free region 14 on the barrier region 16. Suitable conductive materials may be deposited in the remaining portions of the via 60, over the free region 14. In such an embodiment, a smaller programming current applied vertically through the cell structure 10*d* may program the smaller volume of the free region 14 (e.g., in comparison to the volume of the free region in the cell structure 10*c*).

Various embodiments of reducing damage to memory cells are provided, and embodiments are not limited to those illustrated in FIGS. 3-10. In accordance with the present techniques, embodiments may include processes for forming memory cells such that certain regions, such as the free region 14, such that etch or planarization damages may be reduced in those regions. By reducing damage to certain regions which may be more susceptible to damage or regions which may adversely affect the functioning of the memory cell if damaged, cell stability and functionality may be maintained. Specifically, techniques for reducing damage to such regions include forming the cell structure 10 in a contained recess such that etching of the edges may not be necessary or forming the cell structure 10 such that the certain regions (e.g., the free region 14) are protected from etching, planarizing, or other damaging processes.

Furthermore, it should be noted that while the embodiments illustrated in FIGS. 4, 5, 7, 9, and 10 depict a magnetization orientation as parallel to the plane of the substrate in which the cell structure 10 is formed, the present techniques are not limited to any particular magnetization orientation. In some embodiments, the magnetization orientation of the free region 14 and pinned region 18 may be in a different direction (e.g., perpendicular) compared to the depicted magnetization orientations in FIGS. 4, 5, 7, 9, and 10. For example, in some embodiments, the free and pinned regions 14 and 18 may have a magnetization orientation that is perpendicular to a plane of the free and pinned regions 14 and 18 and/or parallel to a direction in which the regions (e.g., regions 12, 14, 16, 18, 20, and 22) are generally deposited. In such embodiments, the free region 14 may similarly be programmed to be parallel or antiparallel to the pinned region 18, indicating different programmed states of the memory cell.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents, and alternatives falling within the spirit and scope of the invention as defined by the following appended claims.

What is claimed is:

1. A confined memory cell structure, comprising:
   a pinned region;
   a dielectric material formed over the pinned region, wherein the dielectric material comprises a via formed within the dielectric material and over the pinned region;
   a barrier region formed within the via and comprising barrier materials conformally deposited to fill a portion of a volume of the via, the barrier region having a first horizontal portion, a second horizontal portion, and vertical portions, wherein the first horizontal portion is formed directly on and in contact with the pinned region, wherein the second horizontal portion is formed directly on top of and in contact with the dielectric material, and wherein the vertical portions are formed along vertical sidewalls of the via;
   a free region formed within the via directly on and in contact with the horizontal portion and the vertical portions of the barrier region such that the barrier region surrounds each vertical periphery of the free region and such that the free region fills an entire remaining volume of the via; and
   a conductive contact formed directly on a top surface of the free region and the barrier region and in contact with the free region and the barrier region, wherein the lateral edges of the conductive contact are vertically aligned with the lateral edges of the pinned region.

2. The confined memory cell structure of claim 1, wherein the pinned region and the free region each comprise Co, Fe, Ni or alloys thereof, the alloys comprising NiFe, CoFe, CoNiFe, CoX, CoFeX, CoNiFeX (X=B, Cu, Re, Ru, Rh, Hf, Pd, Pt, C), $Fe_3O_4$, $CrO_2$, NiMnSb and PtMnSb, BiFeO, or some combination of the above alloys or elements.

3. The confined memory cell structure of claim 1, wherein the barrier region physically separates the pinned region and the free region and suitable for limiting coupling between a magnetization of the free region and a magnetization of the pinned region.

4. The confined memory cell structure of claim 1, wherein vertical edges of the conductive contact are vertically aligned with vertical edges of the pinned region.

5. The confined memory cell structure of claim 1, wherein the entirety of the conductive contact is formed parallel to the top surface of the free region.

6. The confined memory cell structure of claim 1, wherein the confined memory cell structure comprises a spin torque transfer magnetic random access memory (STT-MRAM) cell.

7. The confined memory cell structure of claim 1, wherein a volume of the free region is contained in the via and is surrounded by the barrier region and the conductive contact.

8. A confined memory cell structure, comprising:
   conductive materials deposited in a recess of a dielectric substrate to form a bottom lead;
   antiferromagnetic materials disposed over the bottom lead to form an antiferromagnetic region;
   magnetic materials disposed over the antiferromagnetic region to form a magnetic pinned region;
   dielectric materials disposed over the magnetic pinned region and having a via formed therein to expose a portion of the magnetic pinned region;
   barrier materials deposited to form a barrier region, comprising a first horizontal portion and a vertical portion deposited into the via such that the first horizontal portion and the vertical portion fills a portion of a volume of the via, such that all surfaces of Page 4 the via are covered by the barrier region, and a second horizontal portion is deposited on top of and in contact with the dielectric materials;
   magnetic materials deposited onto the barrier region to form a free region, wherein the free region entirely fills a remaining volume of the via, and wherein a volume of the free region is entirely contained in the via and is surrounded by the barrier region; and
   conductive materials deposited directly on top of the free region and the barrier region to form a top lead, such that the top lead is in direct contact with the free region and the barrier region, a vertical cross-section of the free region is entirely contained by the barrier region and the top lead, and wherein lateral edges of the top lead are vertically aligned with lateral edges of each of the bottom lead, the antiferromagnetic region, and the magnetic pinned region.

9. The confined memory cell structure of claim 8, wherein no portion of the top lead is formed within the via and no portion of the top lead is laterally surrounded by the barrier region.

10. The confined memory cell structure of claim 8, wherein the magnetic pinned region and the free region each comprise Co, Fe, Ni or alloys thereof, the alloys comprising NiFe, CoFe, CoNiFe, CoX, CoFeX, CoNiFeX (X=B, Cu, Re, Ru, Rh, Hf, Pd, Pt, C), $Fe_3O_4$, $CrO_2$, NiMnSb and PtMnSb, BiFeO, or some combination of the above alloys or elements.

11. The confined memory cell structure of claim 8, wherein a largest width of the free region is less than a largest width of the magnetic pinned region.

12. The confined memory cell structure of claim 8, wherein the confined memory cell structure comprises a spin torque transfer magnetic random access memory (STT-MRAM) cell.

13. The confined memory cell structure of claim 8, wherein the bottom lead, the antiferromagnetic region, and the magnetic pinned region have an identical cross-sectional width.

14. The confined memory cell structure of claim 8, wherein the via is centered over the magnetic pinned region.

15. The confined memory cell structure of claim 8, wherein top and bottom surfaces of the top lead are planar.

* * * * *